(12) United States Patent
Seike

(10) Patent No.: US 6,586,923 B2
(45) Date of Patent: Jul. 1, 2003

(54) NON-CONTACT TYPE CURRENT MEASURING INSTRUMENT

(75) Inventor: Takashi Seike, Ehime-ken (JP)

(73) Assignee: Kyoritsu Electrical Instruments Works, Ltd., Tokyo (JP)

( * ) Notice: Subject to any disclaimer, the term of this patent is extended or adjusted under 35 U.S.C. 154(b) by 81 days.

(21) Appl. No.: 09/854,477

(22) Filed: May 15, 2001

(65) Prior Publication Data

US 2001/0052765 A1 Dec. 20, 2001

(30) Foreign Application Priority Data

Jun. 19, 2000 (JP) ........................................ 2000-182656

(51) Int. Cl.$^7$ ............................................... G01R 33/06
(52) U.S. Cl. ............................ 324/117 H; 324/117 R
(58) Field of Search ............................. 324/96, 117 H, 324/117 R, 158.1, 251, 207.2; 361/57, 93.1, 187; 335/18

(56) References Cited

U.S. PATENT DOCUMENTS

| | | |
|---|---|---|
| 1,862,613 A | 6/1932 | Tomoda |
| 5,473,244 A | 12/1995 | Libove et al. |
| 5,701,073 A | 12/1997 | Baker |
| 5,825,175 A * | 10/1998 | Selcuk .................. 324/117 H |
| 5,923,162 A * | 7/1999 | Drafts et al. ............ 324/117 H |
| 6,040,688 A | 3/2000 | Struebin |
| 6,175,229 B1 * | 1/2001 | Becker et al. ........... 324/117 H |
| 6,252,389 B1 * | 6/2001 | Baba et al. ............. 324/117 H |

FOREIGN PATENT DOCUMENTS

| | | |
|---|---|---|
| EP | 0 913 695 | 5/1999 |
| JP | 54-109881 | 8/1979 |
| JP | 56-53540 | 12/1981 |
| JP | 4-431340 | 9/1992 |
| JP | 7-19007 | 5/1995 |
| WO | WO 90/11529 | 10/1990 |

* cited by examiner

Primary Examiner—Vinh P. Nguyen
Assistant Examiner—Jimmy Nguyen
(74) Attorney, Agent, or Firm—Oblon, Spivak, McClelland, Maier & Neustadt, P.C.

(57) ABSTRACT

A non-contact type current measuring instrument includes an armoring member having a pair of guide portions for a conductor under measurement that form therebetween a guide path with an open end; a magnetic core ring for seizing a magnetic flux that has an open space, is embedded in the armoring member, and comprises a semicircular portion, a pair of straight portions continuous to opposite ends of the semicircular portion and parallel to the guide path and a pair of projecting portions continuous to inside edges of the straight portions and bent so as to face each other and be perpendicular to the guide path; and Hall elements each inserted into and brought into intimate contact with an end face of each of the projecting portions, the conductor being inserted via the open end into the guide path and disposed within the core ring. An electric current passing through the conductor is detected by converging on the core ring a magnetic flux generated by the electric current and utilizing the Hall effect of the Hall elements.

2 Claims, 4 Drawing Sheets

NON-CONTACT TYPE CURRENT MEASURING INSTRUMENT

BACKGROUND OF THE INVENTION

1. Field of the Invention

The present invention relates to a non-contact type current measuring instrument for measuring an electric current in a live wire in a state of non-contact with the live wire.

2. Description of the Prior Art

A clamp meter that has heretofore been used as a sensor for measuring both an AC and a DC is of a clamp-type in which a conductor to be measured in terms of an electric current is clamped using an opening-closing core for seizing a magnetic flux.

Such a conventional clamp meter requires adoption of a mechanism for opening and closing a core, making its overall structure complicated and resulting in a high manufacturing cost. Furthermore, since the core-opening and -closing operation is required in the current measurement, the measuring work becomes cumbersome.

Moreover, the clamp meter cannot be used in a narrow space where the core for clamping a conductor under measurement is difficult to open. What is worse, there is a possibility of bad measurement being made when the clamping portions of the core are worn off with repeated opening and closing operations.

An open-type current measuring instrument not requiring a core-opening and -closing operation can eliminate the drawbacks of the clamp meter. Because of the measurement accuracy issues, such as errors in measurement due to differences in position of conductors under measurement, reduction in measurement sensitivity to a microcurrent, an influence of an external magnetic field on an open part, etc., however, the open-type current measuring instrument can only measure an AC. In other words, there has been no non-contact type current measuring instrument that can measure both an AC and a DC.

SUMMARY OF THE INVENTION

The present invention has been accomplished in view of these circumstances. One object of the invention is to provide a non-contact type current measuring instrument with an open-type core, that can effectively overcome the causes of lowering measurement accuracy including errors in measurement due to differences in position of conductors under measurement and reduction in measurement sensitivity to a microcurrent and can measure both an AC and a DC.

To attain the above object, the present invention provides a non-contact type current measuring instrument comprising an armoring member having a pair of guide portions for a conductor under measurement that form therebetween a guide path with an open end; a magnetic core ring for seizing a magnetic flux that has an open space, is embedded in the armoring member, and comprises a semicircular portion, a pair of straight portions continuous to opposite ends of the semicircular portion and parallel to the guide path and a pair of projecting portions continuous to inside edges of the straight portions and bent so as to face each other and be perpendicular to the guide path; and Hall elements each inserted into and brought into intimate contact with an end face of each of the projecting portions, the conductor being inserted via the open end into the guide path and disposed within the core ring, whereby an electric current passing through the conductor is detected by converging on the core ring a magnetic flux generated by the electric current and utilizing the Hall effect of the Hall elements.

The invention includes a non-contact type current measuring instrument wherein the guide portions have a length from the open end of the guide path to the open space of the core ring that is set to be larger than a length of the open space of the core ring.

The above and other objects, characteristic features and advantages of the present invention will become apparent from the detailed description to be made herein below with reference to the accompanying drawings.

BRIEF DESCRIPTION OF THE DRAWINGS

FIG. 5($b$) is an explanatory view illustrating a prior art circular core ring for seizing the magnetic flux of the conductors A and A' under measurement.

DESCRIPTION OF THE PREFERRED EMBODIMENTS

One embodiment of a non-contact type current measuring instrument according to the present invention will be described hereinafter in detail with reference to the accompanying drawings.

Figure 1:
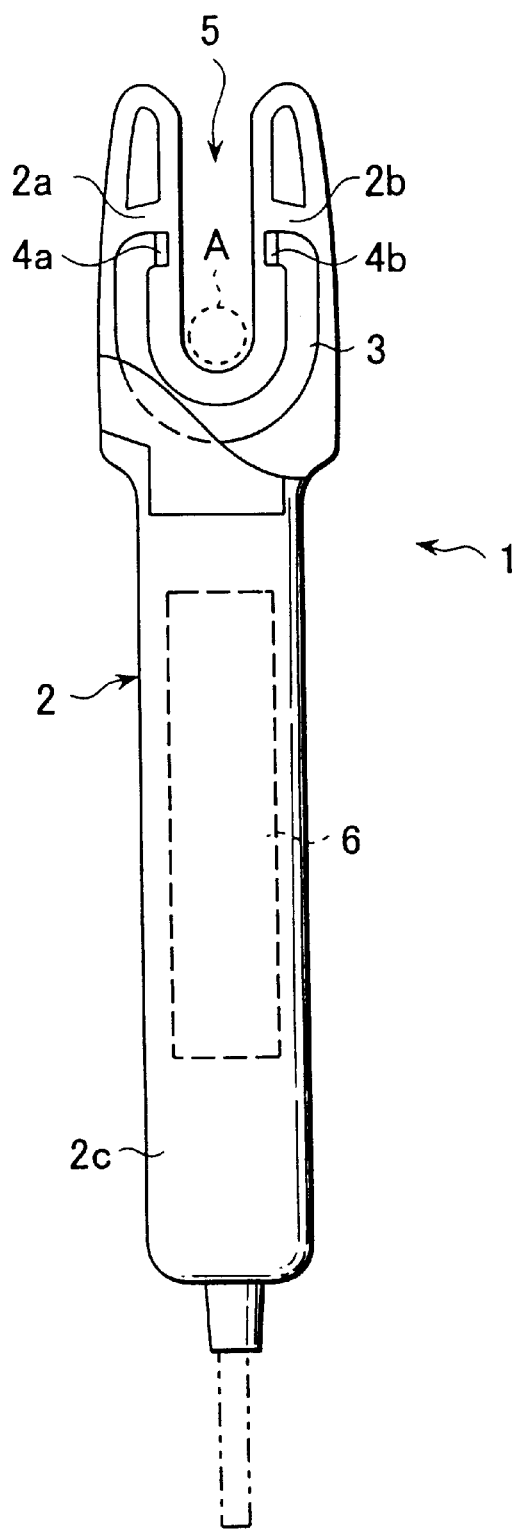
FIG. 1 is a front view showing one embodiment of a non-contact type current measuring instrument with part cutaway for showing an embedded magnetic core ring.

FIG. 1 schematically shows the configuration of a non-contact type current measuring instrument 1 according to the present invention, that comprises an armoring member 2 of acrylonitrile-butadiene-styrene (ABS) resin or other such resin and a sensor section for current measurement that is embedded in the armoring member 2. To be specific, the sensor section comprises a horseshoe-shaped core ring 3 of magnetic material such as Permalloy, ferrite, etc. with an open space for seizing a magnetic flux and a pair of Hall elements 4$a$ and 4$b$ inserted into and brought into contact with the end faces of the core ring across the open space. One end of the armoring member 2 is bifurcated to form a pair of guide portions 2$a$ and 2$b$ that form therebetween a guide path 5 with an open end for a conductor A under measurement. The conductor A is guided along the guide path 5 and located at a position surrounded by the magnetic core ring 3. A magnetic flux produced by the electric current flowing through the conductor A is converged on the magnetic core ring 3, and the amount of the magnetic flux is converted into a voltage value by the Hall effect of the Hall elements 4$a$ and 4$b$ to measure a current value corresponding to the current flowing through the conductor A.

Figure 2:
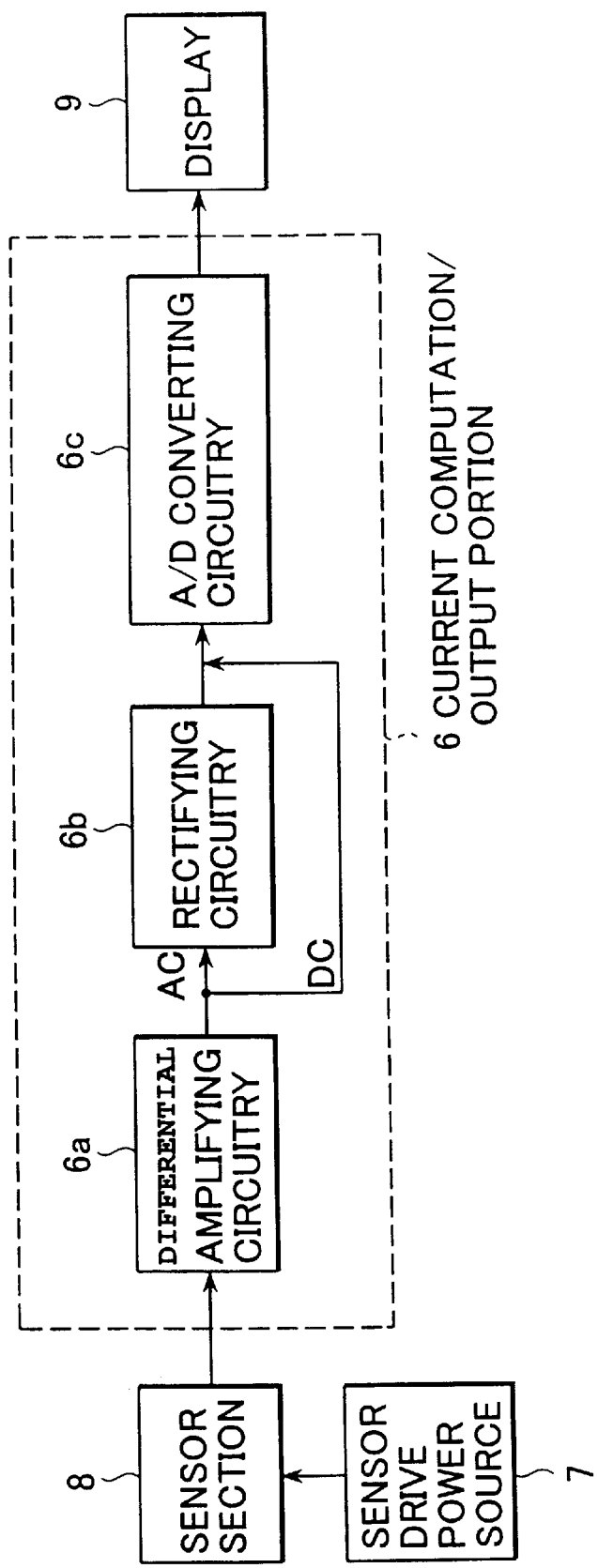
FIG. 2 is a block diagram showing a functional portion for measuring an electric current.

The other end of the armoring member 2 of the portable non-contact type current measuring instrument 1 forms a grasp portion 2$c$ in which a current computation/output portion 6 is embedded. As illustrated in FIG. 2, the current computation/output portion 6 receives an output from a sensor section 8 operated by a sensor drive power source 7, computes a value of the current flowing through the conductor A and outputs the current value into a display 9.

One example of the current computation/output portion 6 comprises a differential amplifying circuitry 6a that receives the voltage output from the sensor section 8 (output from the Hall elements 4a and 4b), a rectifying circuitry 6b that receives the AC voltage output from the differential amplifying circuitry 6a, and an A/D converting circuitry 6c that receives the DC voltage rectified in the rectifying circuitry 6b or the DC voltage not passing through the rectifying circuitry 6b and outputs the value of the current into the display 9. The current value is displayed as a digital value on the display 9. However, it may be displayed on an analogue meter. At any rate, in measuring the current flowing through the conductor A using the Hall effect of the Hall elements 4a and 4b, one technique is suitably selected from among the conventional well-known techniques.

As described above, the non-contact type current measuring instrument 1 in this embodiment is of an open type that can measure both an AC and a DC without having to clamp a conductor unlike the prior art clamp meter. The structure that does not lower measurement accuracy even when using the flux seizing core ring 3 with an open space will be described in detail.

Figure 3:
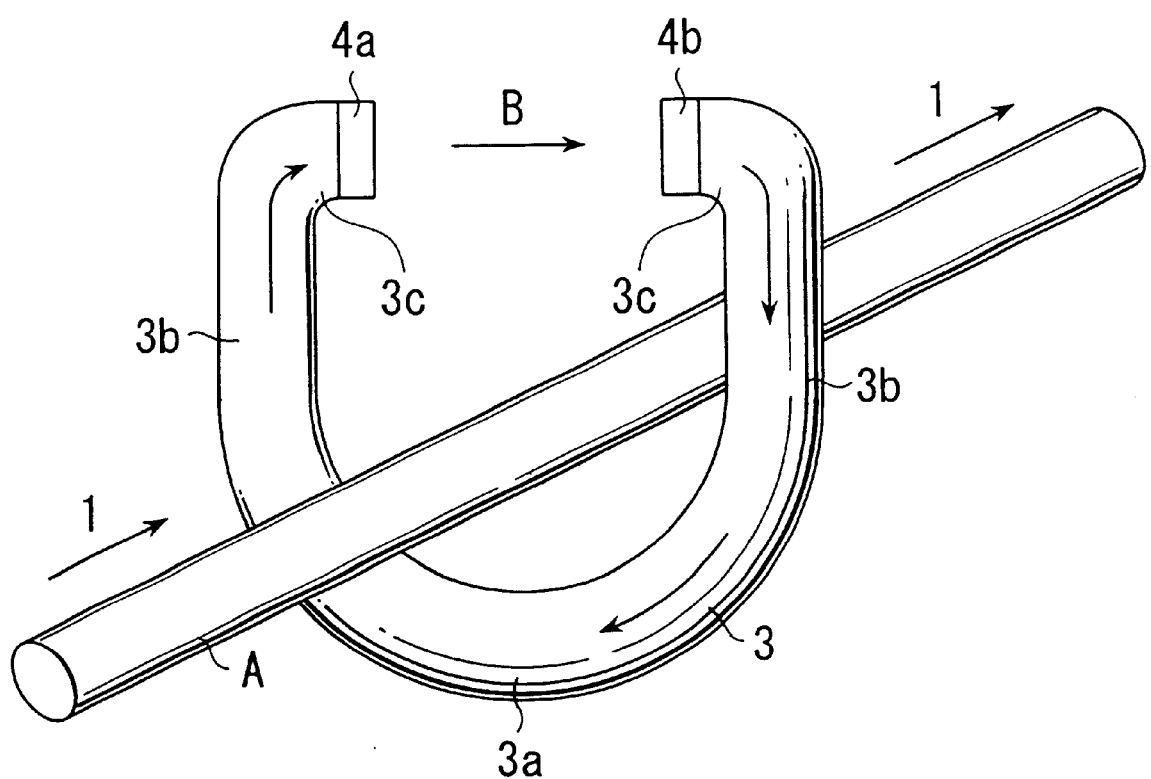
FIG. 3 is an explanatory view illustrating the magnetic core ring that has seized the magnetic flux of a conductor under measurement through which an electric current I flows.
Figure 4:
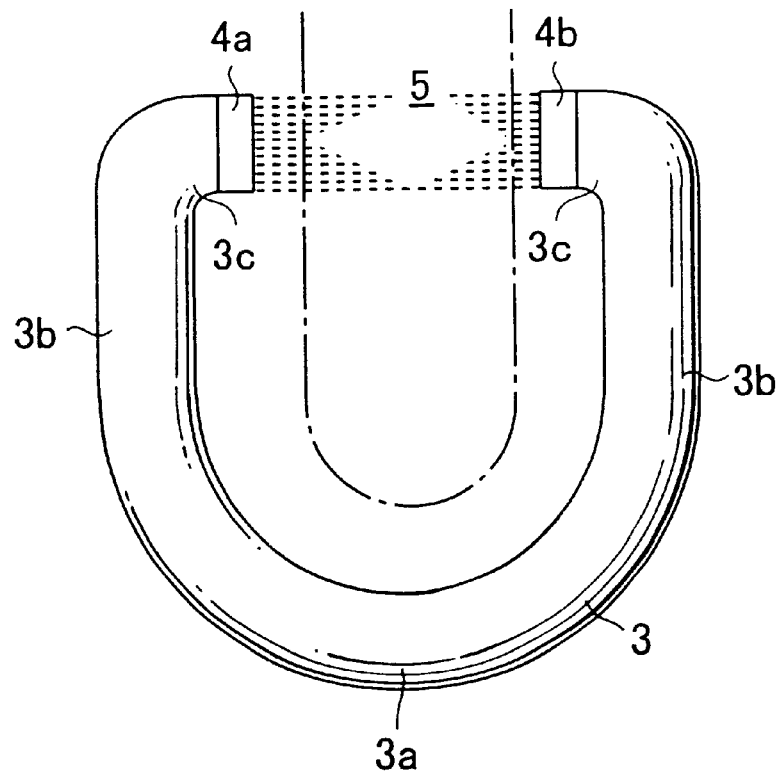
FIG. 4 is a schematic front view showing the magnetic core ring.

As shown in FIG. 3, the magnetic core ring 3 for seizing a magnetic flux has an open space and comprises a semicircular portion 3a, a pair of straight portions 3b continuous to the opposite ends of the semicircular portion 3a and parallel to the guide path 5 (FIG. 1) and a pair of projecting portions 3c continuous to the inside edges of the straight portions 3b and bent so as to face each other and be perpendicular to the guide path 5, thus assuming a substantially U-shape as a whole. The thicker the flux seizing core ring, the larger the amount of magnetic flux seized, but the less the portability. Therefore, the thickness may suitably be determined within the range of degrees of design freedom.

When a current I flows through a conductor A, since the flux seizing core ring 3 is in the state placed in the magnetic field produced by the current I, the magnetic flux is converged on the core ring 3, and a magnetic path is formed in the open space between the projecting portions 3c. In the example of FIG. 3, since the current I flows forward, the clockwise magnetic flux B is seized on the core ring 3 in accordance with the corkscrew rule.

In a magnetic flux seizing core ring having an open space, however, the detection precision will be lowered due to diffusion of a magnetic flux in the open space. To avoid this, the present invention has adopted the magnetic flux seizing core ring 3 having a structure provided with the pair of projecting portions 3c so that the magnetic flux is converged from one to the other projecting portion. Moreover, since Hall elements 4a and 4b are provided on the respective end faces of the projecting portions 3c, the magnetic flux is effectively passed through the Hall elements 4a and 4b to reduce flux leakage resulting from the presence of an open space and measure an electric current with high accuracy.

The provision of the Hall elements 4a and 4b on the respective end faces of the projecting portions 3c enables the outputs from the elements to be well balanced, bringing about reduction in fluctuation of an electric current in a measurement section. When a magnetic flux seizing core ring 3 is fabricated to a size that can measure a conductor having a diameter of 6.0 mm, for example, if the open space has a length of 10.0 mm, an electric current in the range of approximately 10 to 110 mA can be linearly measured.

Figure 5A:
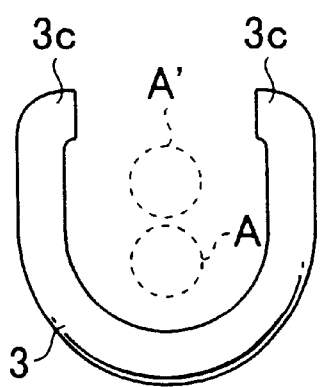
FIG. 5($a$) is an explanatory view illustrating the magnetic core ring for seizing the magnetic flux of conductors A and A' under measurement.
Figure 5B:
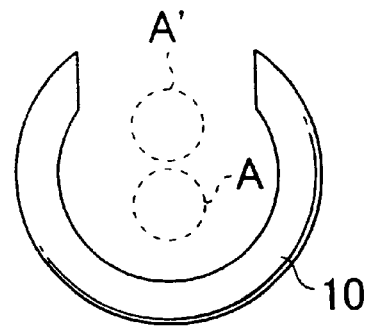

In addition, since the core ring 3 has the pair of straight portions 3b substantially parallel to the guide path 5, fluctuation in current value resulting from possible displacement of a conductor under measurement can be suppressed. In FIG. 5(a) showing the core ring 3 used in the present invention, no considerably large error in measurement will be produced in a conductor A under measurement located at an appropriate position in the core ring 3 and even in a conductor A' under measurement located at a position closer to the open space of the core ring 3 than the conductor A. In the case of the conventional circular core 10 shown in FIG. 5(b), however, measurement variation will arise in a conductor A' under measurement that is located at a position closer to the open space of the circular core than a measurement conductor A. When a conductor under measurement has a diameter of 3.5 mm, for example, the fluctuation will be about ±1.2 to 2.2% in the measurement section of the present core ring 3 and that will be about ±2.5 to 4.2% in the measurement section of the conventional circular core 10.

As described above, use of the magnetic flux seizing core ring 3 having the straight portions 3b and projecting portions 3c suppresses a decrease in measurement accuracy to a great extent and provides an open non-contact type current measuring instrument 1 that can measure both an AC and a DC. This embodiment further adopts a structure of the guide portions 2a and 2b with a large length set such that the length from the open end of the guide path 5 to the open space of the core ring 3 is larger than the length of the open space of the core ring 3 (FIG. 1). The larger length of the guide portions 2a and 2b can prevent factors (magnetic substances and iron metals, for example) that make turbulent the magnetic field produced in the open space part of the core ring 3 when a conductor A is inserted via the guide path 5 and located at a measurement position from approaching the magnetic field. Therefore, a measurement error resulting from an external magnetic field can be suppressed.

The non-contact type current measuring instrument according to the present invention is not limited to the aforementioned embodiment, but can be modified in detailed structure within the scope of the appended claims.

As has been described in the foregoing, since the non-contact type current measuring instrument according to the present invention uses a magnetic core ring for seizing a magnetic flux comprising a semicircular portion, a pair of straight portions continuous to the opposite ends of the semicircular portion and parallel to the guide path and a pair of projecting portions continuous to the inside edges of the straight portions and bent so as to face each other and be perpendicular to the guide path and further uses Hall elements each inserted into and brought into intimate contact with the end face of each of the projecting portions, it is possible to provide an open-type current measuring instrument that can effectively overcome the causes of lowering measurement accuracy including errors in measurement due to differences in position of conductors under measurement and reduction in measurement sensitivity to a microcurrent and can measure both an AC and a DC without having to clamp the measurement conductors.

According to the non-contact type current measuring instrument of the present invention, therefore, there is no need of using a mechanism for opening and closing a core that has been required by a conventional clamp meter, making the overall structure simple and the manufacturing cost low. Furthermore, since the core-opening and -closing operation is not required in the current measurement, the measuring work becomes easy to conduct. Moreover, the instrument can be used in a narrow space where the core of the conventional clamp meter for clamping a conductor under measurement has been difficult to open. What is better, there is no possibility of inaccurate measurement that was made when the clamping portions of the conventional clamp meter core had been worn off with repeated opening and closing operations being experienced. Thus, the instrument has high reliability.

Furthermore, since the guide portions have a length from the open end of the guide path to the open space of the core ring that is set to be larger than the length of the open space of the core ring, factors that make turbulent the magnetic field in the open space part can be prevented from approaching the magnetic field, a measurement error resulting from an external magnetic field can be suppressed. Thus, high-accuracy current measurement can be realized.

What is claimed is:

1. A non-contact type current measuring instrument comprising:

an armoring member having a pair of guide portions for a conductor under measurement that form therebetween a guide path with an open end;

a magnetic core ring for seizing a magnetic flux that has an open space, is embedded in the armoring member, and comprises a semicircular portion, a pair of straight portions continuous to opposite ends of the semicircular portion and parallel to the guide path and a pair of projecting portions continuous to inside edges of the straight portions and bent so as to face each other and be perpendicular to the guide path; and Hall elements each inserted into and brought into intimate contact with an end face of each of the projecting portions, the conductor being inserted via the open end into the guide path and disposed within the core ring;

whereby an electric current passing through the conductor is detected by converging on the core ring a magnetic flux generated by the electric current and utilizing the Hall effect of the Hall elements.

2. The non-contact type current measuring instrument according to claim 1, wherein the guide portions have a length from the open end of the guide path to the open space of the core ring that is set to be larger than a length of the open space of the core ring.

* * * * *